United States Patent [19]

Yun et al.

[11] Patent Number: 5,095,229

[45] Date of Patent: Mar. 10, 1992

[54] FULL-SWING BICMOS DRIVER

[75] Inventors: Byung W. Yun, Bucheon; Myung J. Choe, Incheon, both of Rep. of Korea

[73] Assignee: Samsung Electronics Co., Ltd., Suweon, Rep. of Korea

[21] Appl. No.: 594,844

[22] Filed: Oct. 9, 1990

[30] Foreign Application Priority Data

Jan. 25, 1990 [KR] Rep. of Korea .................. 90-887

[51] Int. Cl.$^5$ .................................... H03K 19/01
[52] U.S. Cl. .................................... 307/446; 307/443; 307/570
[58] Field of Search ............... 307/443, 446, 451, 570, 307/594, 597, 605

[56] References Cited

U.S. PATENT DOCUMENTS

| | | | |
|---|---|---|---|
| 4,845,385 | 7/1989 | Ruth, Jr. ........................ | 307/446 |
| 4,871,928 | 10/1989 | Bushey ........................... | 307/451 X |
| 4,877,980 | 10/1989 | Kubinec .......................... | 307/594 X |
| 5,001,365 | 3/1991 | Murabayashi et al. ............. | 307/446 |
| 5,010,257 | 4/1991 | Boudon et al. ................... | 307/446 |

OTHER PUBLICATIONS

Lin et al., "Complementary MOS-Bipolar Transistor Structure", *IEEE T.E.L.D.*, vol. ED-16, No. 11, Nov. 1969.

Primary Examiner—David Hudspeth
Attorney, Agent, or Firm—Ladas & Parry

[57] ABSTRACT

A full-swing BiCMOS driver comprising an inverter for inverting an input signal, which includes two pairs of NMOS and PMOS transistors to invert an input signal and to prevent current leakage, a full-down controlling part for providing control signals, an output driving part for providing an output, and a delay-inverter for delaying and inverting the input signal which includes a delay part having two transmission gates to serve as resistors. According to the present invention, a full-swing BiCMOS driver which provides a full-swing logic value and prevents any additional power consumption by means of the delaying inverter.

5 Claims, 2 Drawing Sheets

FULL-SWING BICMOS DRIVER

BACKGROUND OF THE INVENTION

The present invention relates to a BiCMOS logic circuit, and more particularly to a full-swing BiCMOS driver which has fast switching characteristics with low power consumption.

FIG. 1 shows an inverter of conventional BiCMOS logic circuits. In FIG. 1, a pull-up controlling part 1 pulls an output up to high level when an input signals is in a low level state and includes each PMOS and NMOS transistor P1 and N1 of which drains are connected with each other. Also, a pull-down controlling part 2 pulls the output down to low level when the output signal is in high level state and includes each NMOS transistor N2 and N3, in which the gate of the NMOS transistor N2 is connected to an input terminal VIN and the drain of the NMOS transistor N2 is connected to an output terminal VOUT.

In the pull-down controlling part 2, the NMOS transistor N3 is connected to the source of the NMOS transistor N2 and the gate of the NMOS transistor N3 is connected to the base of a transistor Q1 in an output driving part 3, so that when a low level signal is applied to the input terminal VIN, the NMOS transistor N3 is turned on by a high level potential applied to the base of the transistor Q1 in the output driving part 3.

The output driving part 3 for providing an output signal according to signals of the pull-up and pull-down controlling parts 1 and 2 includes the transistor Q1 and another transistor Q2 which are interconnected, being turned on respectively by driving the PMOS transistor P1 in the full-up controlling part 1 and the NMOS transistor N2 in the pull-down controlling part 2.

In this conventional BiCMOS inverter, when a high level signal is applied to the input terminal VIN, the PMOS transistor P1 in the pull-up controlling part 1 is turned off and the NMOS transistor N1 is turned on. Thus, charge stored in the base of transistor Q1 is discharged toward the output terminal VOUT. Also, if the PMOS transistor P1 is turned off, the drain of the PMOS transistor P1 becomes a low level state and the transistor Q1 is turned off, so a low level signal is provided from the output terminal VOUT.

On the other hand, the NMOS transistor N2 in the pull-down controlling part 2 is turned on by the high level signal applied to the input terminal VIN and then the transistor Q2 is turned on. Thus, the output terminal VOUT provides the low level signal corresponding to a collector-to-emitter saturation voltage VCE of the transistor Q2.

By contrast, if a low level signal is applied to the input terminal VIN, the PMOS transistor P1 in the pull-up controlling part 1 is turned on, while the NMOS transistor N1 is turned off. Thus, the drain of the PMOS transistor P1 becomes a high level state thereby turning on the transistor Q1 in the output driving part 3.

On the other hand, the NMOS transistor N2 is turned off since the input signal is low and then the transistor Q2 in the output driving part 3 is turned off. Also, the charge stored in the base of the transistor Q2 is discharged toward the ground since the NMOS transistor N3 is turned on by the high level the drain in the PMOS transistor P1. Thus, the output terminal VOUT provides a high level signal but this high level signal corresponds to the level diminished by a base-to-emitter voltage VBE from a supply voltage VDD.

In this conventional BiCMOS inverter, the high level output corresponds to that lowered by the base-to-emitter voltage VBE from the supply voltage VDD while the low level output corresponds to the collect-emitter voltage VCE. Thus, this inverter can't provide the full-swing signal. In order to solve this problem, a CMOS inverter was added to the conventional BiCMOS inverter to achieve the full-swing of the output voltage.

FIG. 2 shows the conventional full-swing invert. in FIG. 2, the inverter I1 replaces pull-up controlling part 1 of a conventional BiCMOS inverter and another inverter I2 is located between the input and output terminals VIN and VOUT in order to provide the full-swing signal of the output voltage.

Accordingly, if a low level signal is applied to the input terminal VIN, the low level signal is inverted to a high level by the inverter I2 and such a high level signal is provided to the output terminal VOUT. By contrast, if a high level signal is applied to the input terminal VIN, a low level signal inverted by the inverter I2 is provided. This circuit provides the full-swing signal but additional power consumption is also required since current flows from the supply voltage VDD to ground during the switching time of the inverter I2.

SUMMARY OF THE INVENTION

The present invention has an object to provide a full-swing BiCMOS driver which provides the full-swing logic value and prevents any additional power consumption by using a delay-inverter.

According to the present invention, there is provided a full-swing BiCMOS driver comprising: an inverter for inverting an input signal from an input terminal; a pull-down controlling part for providing control signals according to said input signal or an output of said inverter; an output driving part for providing an output according to the control of said inverter and said pull-down controlling part; and a delay-inverter for delaying and inverting said input signal between said input terminal and an output terminal.

BRIEF DESCRIPTION OF DRAWINGS

These and other objects, features, and advantages of the present invention will become more apparent from the following description for the preferred embodiments taken in conjunction with the accompanying drawings, in which.

DETAILED DESCRIPTION OF THE PREFERRED EMBODIMENT

The present invention will be now described in more detail with reference to the accompanying drawings.

Figure 1:
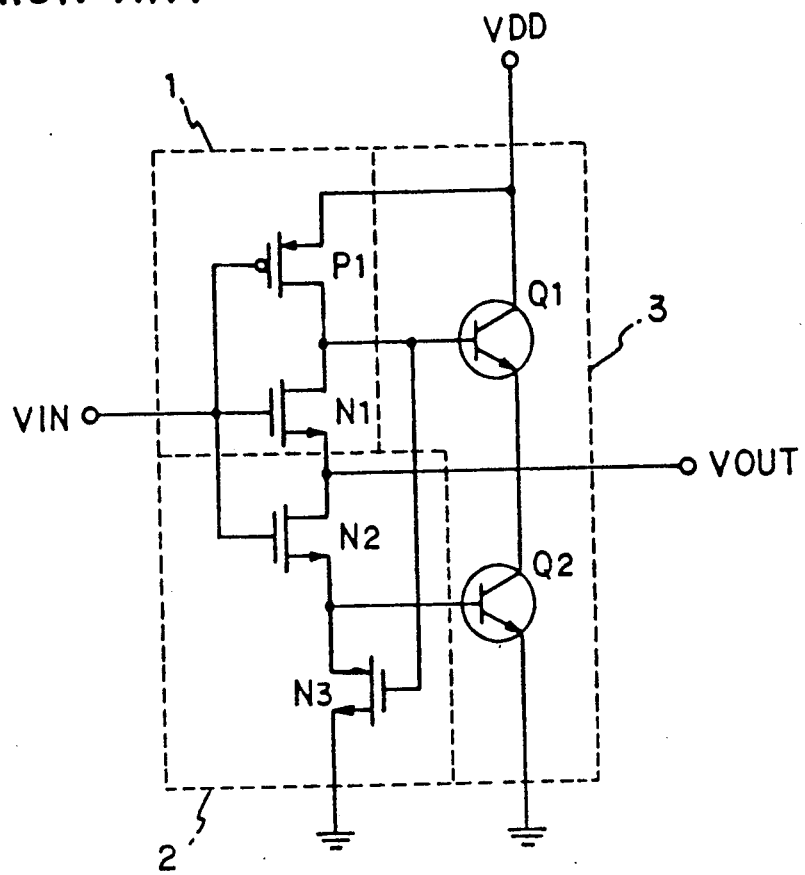
FIG. 1 is a circuit diagram illustrating a conventional BiCMOS inverter.
Figure 2:
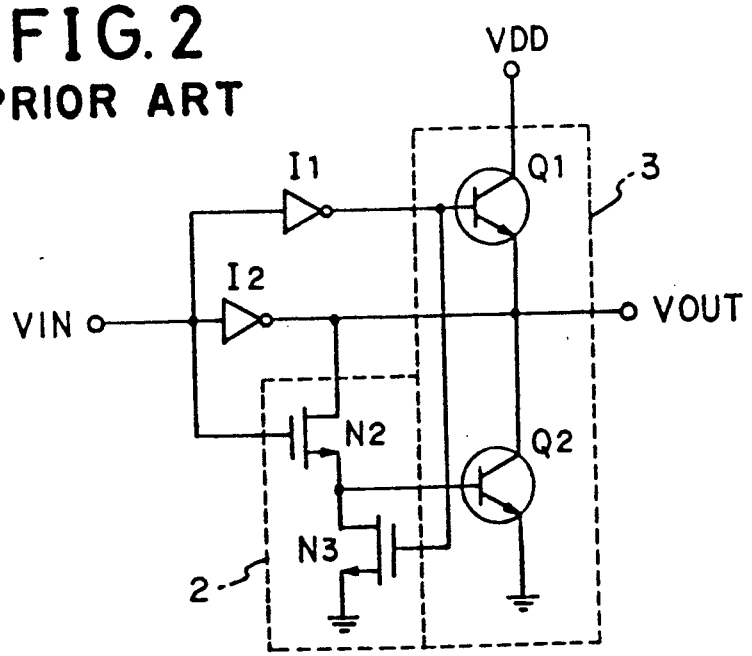
FIG. 2 is a circuit diagram illustrating a conventional full-swing BiCMOS inverter.
Figure 3:
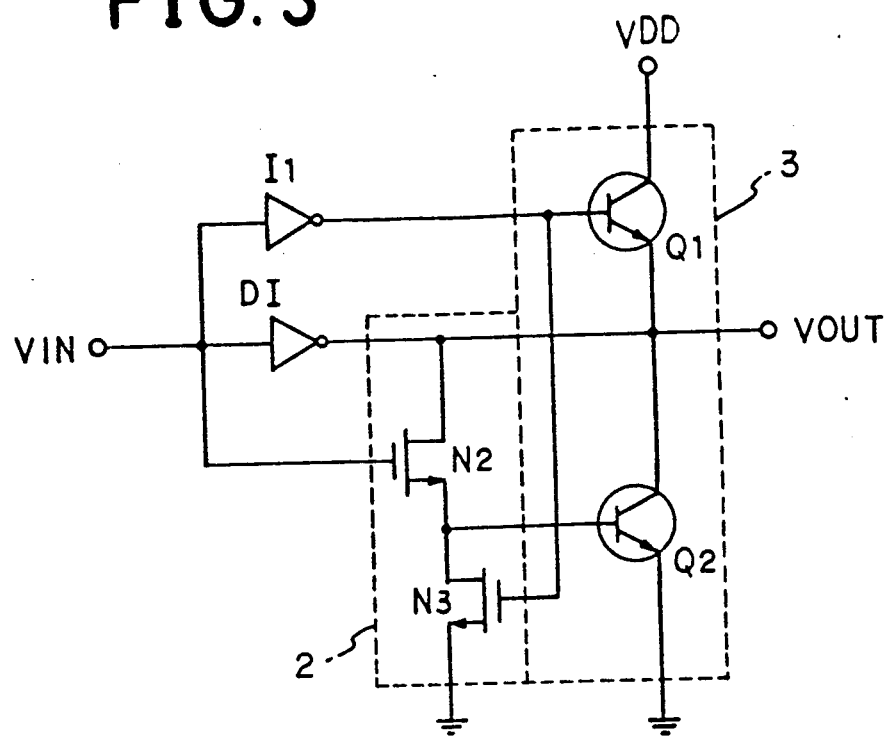
FIG. 3 is a circuit diagram illustrating a full-swing BiCMOS driver according to the present invention.

FIG. 3 shows a full-swing BiCMOS driver according to the present invention. In FIG. 3, an inverter I1 for inverting an input signal and a delay-inverter DI for delaying and inverting an input signal are commonly connected to an input terminal VIN.

A pull-down controlling part 2 includes the inverter I1 and delay-inverter DI which are commonly connected each other in parallel and with the input terminal VIN. The pull-down controlling part 2 controls an output driving part 3. The NMOS transistor N2 has a gate connected with the input terminal VIN and a drain connected to an output terminal VOUT. Thus, when a high level signal is applied to the input terminal VIN, the NMOS transistor N2 is turned on. Also, the NMOS transistor N3 is connected to the source of the NMOS transistor N2 and has a gate connected to the base of a transistor Q1 in the output driving part 3. Thus, when a low level signal is applied to the input terminal VIN, the NMOS transistor N3 is turned on by the high level at the base of the transistor Q1 in the output driving part 3.

The output driving part 3 is connected to the inverter I1 and delay-inverter DI behind the pull-down controlling part 2 and includes two interconnected transistors Q1 and Q2, in which the transistor Q1 is driven by an output of the inverter I1 and the transistor Q2 is turned on by driving the NMOS transistor N2 in the pull-down controlling part 2. The emitter of the transistor Q1 and the output of the delay-inverter DI are connected to the output terminal VOUT so that the output signal from the output terminal VOUT is controlled by the delay-inverter DI.

Figure 4:
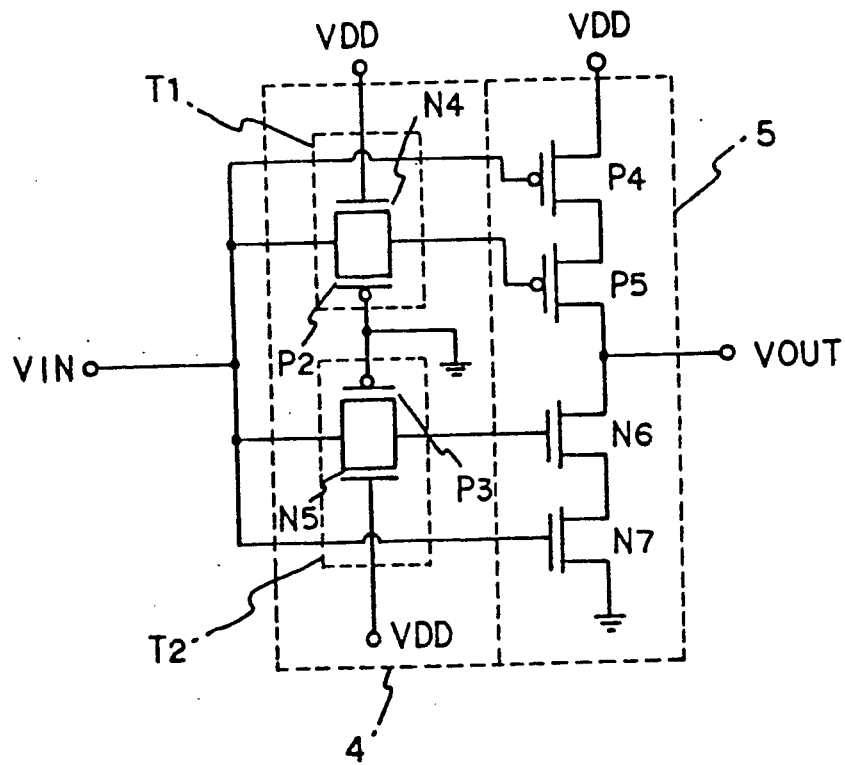
FIG. 4 is a circuit diagram illustrating a delay-inverter which is included in the full-swing BiCMOS driver according to the present invention.

FIG. 4 is the circuit diagram of the delay-inverter DI. In FIG. 4, a delaying part 4 delays the input signal applied to the input terminal VIN and includes two transmission gates T1 and T2 commonly connected to the input terminal VIN. Gates of NMOS transistors N4 and N5 in the transmission gates T1 and T2 are connected to each supply voltage VDD, while those of PMOS transistors P2 and P3 are grounded. Thus, the NMOS and PMOS transistors are always turn on to serve as resistors and delays the input signal together with parasitic capacitors at the gate of a MOS transistor in next stage. These transmission gates T1 and T2 may be replaced by resistors.

An inverter part 5 is to invert the input signal delayed by the delaying part 4 and includes a pair of PMOS and NMOS transistors P4 and N7 for preventing current leakage and another pair of PMOS and NMOS transistors P5 and N6 connected to the transmission gates T1 and T2 to serve as an inverter. The PMOS transistors P4, P5 and the NMOS transistors N6, N7 are interconnected in sequence order.

In the full-swing BiCMOS driver including this delay-inverter DI according to the present invention, if a high level signal is applied to the input terminal VIN, the high level signal is inverted to a low level state by the inverter I1 and applied to the base of the transistor Q1 during time that the the input signal is delayed by the delaying inverter DI. Thus, the transistor Q1 is turned off and the NMOS transistor N2 is turned on so that the high level signal is applied to the base of the transistor Q2 in the output driving part 3. Consequently, the transistor Q2 is turned on and a low level signal corresponding to the collector-to-emitter saturation voltage VCE is provided from the output terminal VOUT.

On the other hand, the high level signal applied to the delaying inverter DI is delayed by the delaying part 4 and applied to the inverter 5 formed of the PMOS and NMOS transistors P5 and N6. Then, the PMOS transistors P4 and P5 are turned off, while the NMOS transistors N6 and N7 are turned on so that a low level signal corresponding to the ground is provided from the output terminal VOUT. Thus, the output voltage from the output terminal VOUT is reduced from the collector-to-emitter saturation voltage VCE to the complete ground level.

Moreover, during the high level signal is delayed by the delaying part 4, the gate of the PMOS transistor P4 for preventing current leakage remains in the turn-off state by the high level signal applied to the gate of the PMOS transistor P2, so that the current leakage from the supply voltage VDD to the ground is prevented.

To the contrary, if a low level signal is applied to the input terminal VIN, the NMOS transistor N2 in the pull-down controlling part 2 is turned off during the time that the low level signal is delayed by the delay-inverter DI and the transistor Q2 is also turned off.

In the other hand, the low level signal is inverted to the high level state by the inverter I1 and is applied to the base of the transistor Q1 in the output driving part 3. Then, the transistor Q1 is turned on the high level is provided from the output terminal VOUT, where, this high level signal corresponds to the value diminished by the base-to-emitter turn-on voltage VBE from the power supply voltage VDD.

Thus, the output terminal VOUT can not provide the high level signal of the full-swing value. But, the low level signal applied to the delaying inverter DI is delayed by the delaying part 4 and is applied to the inverter 5 formed of the PMOS and NMOS transistor P5 and N6. Then, the PMOS transistors P4 and P5 are turned on, while the NMOS transistors N6 and N7 are turned off, so that a high level signal supplied with the full-swing value from the supply voltage VDD is provided from the output terminal VOUT. Moreover, during the time that the low level signal is delayed by the delaying part 4, the NMOS transistor N7 for preventing current leakage remains in the turn-off state by the low level signal applied thereto so that the current leakage from the supply voltage VDD to the ground can be prevented.

As mentioned hereinabove, according to the present invention the full-swing signal can be provided with minimum power consumption and the fast switching time by adding a delay-inverter with MOS transistors for preventing current leakage to the conventional BiCMOS inverter, and particularly the delay-inverter can be applicable to BiCMOS logic gates such as AND, NOR, and so on.

The present invention is in no way limited to the embodiment described hereinabove. Various modifications of diclosed embodiment as well as other embodiments of the invention will become apparent to persons skilled in the art upon reference to the description of the invention. It is therefore contemplated that the appended claims will cover any such modifications or embodiments as fall within the true scope of the invention.

What is claimed is:

1. A full-swing BiCMOS driver comprising:
   an inverter for inverting an input signal from an input terminal;
   a pull-down controlling means for providing control signals according to said input signal and an output signal of said inverter;
   an output driving means for providing an output signal according to the control of said inverter and said pull-down controlling means; and a delay-inverter for delaying and inverting said input signal coupled between said input terminal and an output terminal.

2. A full-swing BiCMOS driver according to claim 1, wherein said delay-inverter includes a delaying means for delaying said input signal and an inverter for inverting said delayed input signal.

3. A full-swing BiCMOS driver according to claim 2, wherein said delaying means includes transmission gates in which gates of NMOS transistors are connected to a power supply voltage and gates of PMOS transistors are grounded whereby said transmission gates act as resistors.

4. A full-swing inverter according to claim 2, wherein said inverter includes NMOS and PMOS transistors for inverting said delayed input signal and for preventing current leakage to ground.

5. A full-swing BiCMOS driver according to claim 3, wherein resistance means are substituted for said transmission gates.

* * * * *